United States Patent
Pathak et al.

(10) Patent No.: US 11,492,705 B2
(45) Date of Patent: Nov. 8, 2022

(54) ISOLATOR APPARATUS AND METHODS FOR SUBSTRATE PROCESSING CHAMBERS

(71) Applicant: Applied Materials, Inc., Santa Clara, CA (US)

(72) Inventors: Nitin Pathak, Mumbai (IN); Amit Kumar Bansal, Milpitas, CA (US); Tuan Anh Nguyen, San Jose, CA (US); Thomas Rubio, Santa Clara, CA (US); Badri N. Ramamurthi, Los Gatos, CA (US); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 20 days.

(21) Appl. No.: 16/896,982

(22) Filed: Jun. 9, 2020

(65) Prior Publication Data
US 2021/0002763 A1 Jan. 7, 2021

(30) Foreign Application Priority Data

Jul. 4, 2019 (IN) .............................. 201941026844

(51) Int. Cl.
*C23C 16/458* (2006.01)
*C23C 16/455* (2006.01)
*C23C 16/44* (2006.01)

(52) U.S. Cl.
CPC ...... *C23C 16/4585* (2013.01); *C23C 16/4412* (2013.01); *C23C 16/45565* (2013.01); *H01J 2329/94* (2013.01); *H01J 2329/941* (2013.01)

(58) Field of Classification Search
CPC .......... C23C 16/4585; C23C 16/45565; C23C 16/4412; C23C 16/45521; C23C 16/4408
(Continued)

(56) References Cited

U.S. PATENT DOCUMENTS 10,157,755 B2   12/2018   Chandrasekharan et al.
10,600,624 B2 *  3/2020   Ghosh ............... H01J 37/32522
(Continued)

FOREIGN PATENT DOCUMENTS

CN   102763199 A   10/2012
JP   H1136076 A    2/1999
(Continued)

OTHER PUBLICATIONS

International Search Report and Written Opinion dated Sep. 23, 2020 for Application No. PCT/US2020/036801.
(Continued)

*Primary Examiner* — Rudy Zervigon
(74) *Attorney, Agent, or Firm* — Patterson + Sheridan, LLP

(57) ABSTRACT

Aspects of the present disclosure relate generally to isolator devices, components thereof, and methods associated therewith for substrate processing chambers. In one implementation, a substrate processing chamber includes an isolator ring disposed between a pedestal and a pumping liner. The isolator ring includes a first surface that faces the pedestal, the first surface being disposed at a gap from an outer circumferential surface of the pedestal. The isolator ring also includes a second surface that faces the pumping liner and a protrusion that protrudes from the first surface of the isolator ring and towards the outer circumferential surface of the pedestal. The protrusion defines a necked portion of the gap between the pedestal and the isolator ring.

14 Claims, 3 Drawing Sheets

(58) Field of Classification Search
USPC .................. 118/715; 156/345.33, 345.34
See application file for complete search history.

(56) References Cited

U.S. PATENT DOCUMENTS

| | | |
|---|---|---|
| 2001/0004478 A1 | 6/2001 | Zhao et al. |
| 2001/0050233 A1 | 12/2001 | Uzoh et al. |
| 2002/0025657 A1 | 2/2002 | Anderson et al. |
| 2007/0107653 A1 | 5/2007 | Yamada |
| 2007/0281084 A1 | 12/2007 | Hirosawa et al. |
| 2009/0084317 A1 | 4/2009 | Wu et al. |
| 2010/0279008 A1* | 11/2010 | Takagi .............. H01L 21/02197 118/725 |
| 2012/0009765 A1* | 1/2012 | Olgado ............. C23C 16/45565 257/E21.09 |
| 2015/0056108 A1 | 2/2015 | Gytri et al. |
| 2016/0002788 A1 | 1/2016 | Nal et al. |
| 2018/0320266 A1 | 11/2018 | Nal et al. |
| 2019/0122872 A1* | 4/2019 | Ghosh ................ C23C 16/4408 |

FOREIGN PATENT DOCUMENTS

| | | |
|---|---|---|
| JP | 2010263112 A | 11/2010 |
| KR | 101535155 B1 | 7/2015 |
| WO | 02052069 A1 | 7/2002 |

OTHER PUBLICATIONS

International Search Report and Written Opinion dated Mar. 9, 2020 for Application No. PCT/US2019/061656.

\* cited by examiner

ISOLATOR APPARATUS AND METHODS FOR SUBSTRATE PROCESSING CHAMBERS

CROSS-REFERENCE TO RELATED APPLICATIONS

This application claims benefit of India provisional patent application serial number 201941026844, filed Jul. 4, 2019, which is herein incorporated by reference.

BACKGROUND

Field

Aspects of the present disclosure relate generally to isolator devices, components thereof, and methods associated therewith for substrate processing chambers.

Description of the Related Art

During substrate processing operations, such as chemical vapor deposition (CVD) operations, processing gases may diffuse below a top surface of a pedestal. The diffused processing gases result in deposition of material onto outer surfaces of the pedestal and/or other components or surfaces of the substrate processing chamber that are not the substrate. The deposition can delay substrate processing operations, cause production downtime for substrate processing chambers, result in increased cleaning time, reduce throughput, cause nonuniform deposition on the substrate, and/or cause substrate defects.

Therefore, there is a need for a device that reduces diffusion of processing gases below the top surface of the pedestal.

SUMMARY

Aspects of the present disclosure relate generally to isolator devices, components thereof, and methods associated therewith for substrate processing chambers.

In one implementation, a substrate processing chamber includes a chamber body, a showerhead having one or more gas openings formed in a lower surface of the showerhead, and a pedestal disposed in the chamber body. The pedestal has a support surface and an outer circumferential surface. The support surface faces the showerhead. The substrate processing chamber also includes a pumping liner disposed around the pedestal and encircling the pedestal. The pumping liner has a first outer surface that faces the outer circumferential surface of the pedestal and a second outer surface that faces the chamber body. The substrate processing chamber also includes an isolator ring disposed between the pedestal and the pumping liner. The isolator ring includes a first surface that faces the pedestal, the first surface being disposed at a gap from the outer circumferential surface of the pedestal. The isolator ring also includes a second surface that faces the pumping liner and a protrusion that protrudes from the first surface of the isolator ring and towards the outer circumferential surface of the pedestal. The protrusion defines a necked portion of the gap between the pedestal and the isolator ring.

In one implementation, a substrate processing chamber includes a chamber body and a showerhead having one or more gas openings formed in a lower surface of the showerhead. The substrate processing chamber also includes a pedestal disposed in the chamber body, the pedestal having a support surface and an outer circumferential surface. The support surface faces the showerhead. The substrate processing chamber also includes a pumping liner disposed around the pedestal and encircling the pedestal. The pumping liner has a first outer surface that faces the outer circumferential surface of the pedestal and a second outer surface that faces the chamber body. The substrate processing chamber also includes an isolator ring disposed between the pedestal and the pumping liner. The isolator ring includes a first surface that faces the pedestal, a second surface that faces the pumping liner, and a tapered upper surface. The tapered upper surface defines an upper edge of the isolator ring, and the upper edge of the isolator ring is disposed above the support surface of the pedestal.

In one implementation, a non-transitory computer-readable medium includes instructions that, when executed, cause a substrate processing chamber to flow one or more processing gases at a first flow rate. The one or more processing gases are flown from a showerhead above a pedestal and into a processing region of the substrate processing chamber. The instructions, when executed also cause the substrate processing chamber to flow one or more purge gases at a second flow rate from a purge gas inlet. The second flow rate has a ratio of the second flow rate relative to the first flow rate, and the ratio is within a range of 0.25 to 0.75 of the first flow rate.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only common implementations of this disclosure and are therefore not to be considered limiting of its scope, for the disclosure may admit to other equally effective implementations.

Figure 1A:
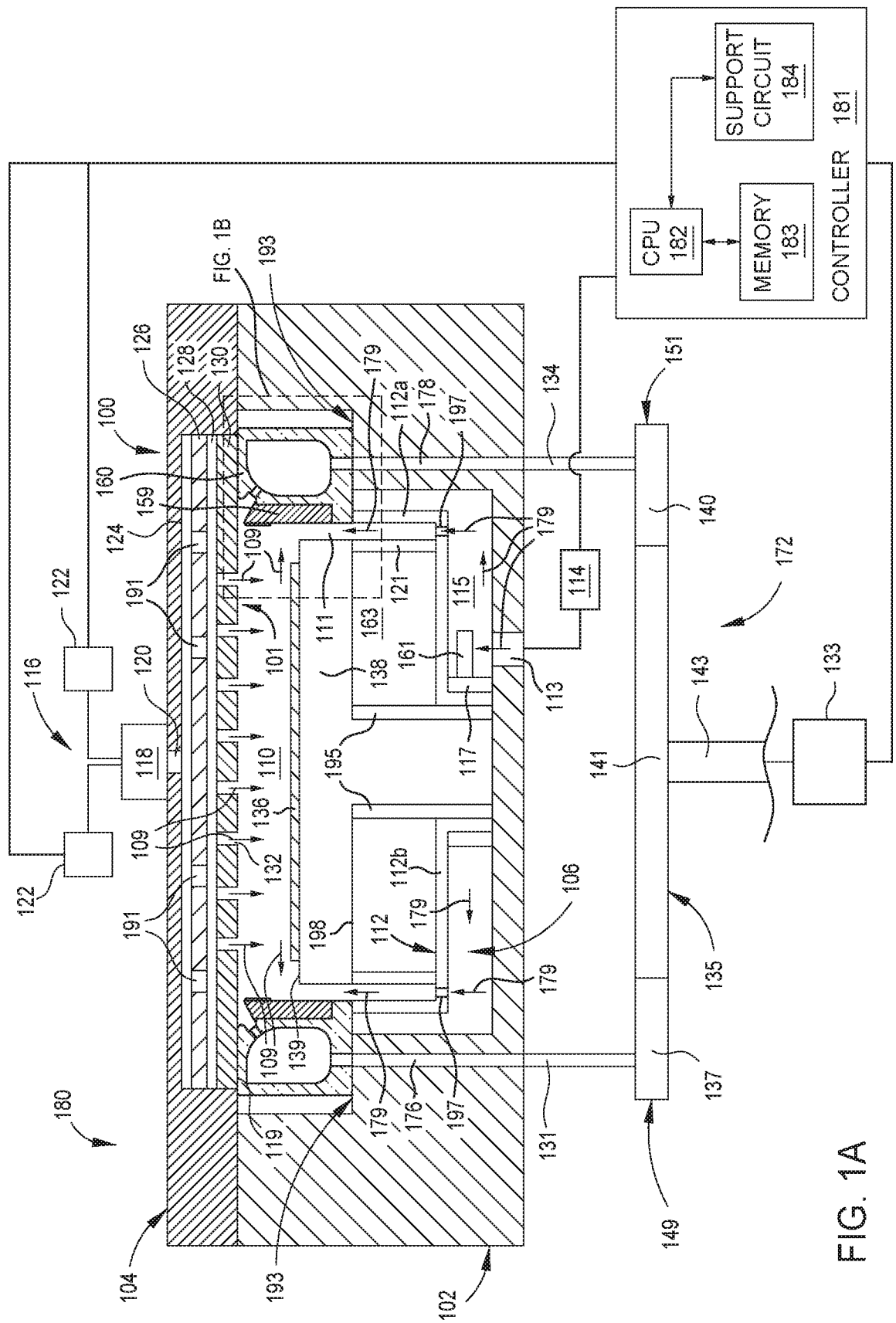
FIG. 1A is a schematic cross-sectional view of a substrate processing chamber, according to one implementation.

To facilitate understanding, identical reference numerals have been used, where possible, to designate identical elements that are common to the figures. It is contemplated that elements disclosed in one implementation may be beneficially utilized on other implementations without specific recitation.

DETAILED DESCRIPTION

Aspects of the present disclosure relate generally to isolator devices, components thereof, and methods associated therewith for substrate processing chambers.

FIG. 1A is a schematic cross-sectional view of a substrate processing chamber 100, according to one implementation. The substrate processing chamber 100 may be, for example, a chemical vapor deposition (CVD) chamber or a plasma enhanced CVD chamber. The present disclosure contemplates that other chambers may be used, such as an atomic layer deposition (ALD) chamber or a physical vapor deposition (PVD) chamber. The substrate processing chamber 100 has a chamber body 102 and a chamber lid 104 disposed on the chamber body 102. The chamber body 102 includes an internal volume 106 therein. The internal volume 106 is the space defined by the chamber body 102 and the chamber lid 104. The present disclosure contemplates that the chamber body 102 may be made of a single body, or two or more bodies. The chamber body 102 includes one or more sidewalls and a base.

The substrate processing chamber 100 includes a gas distribution assembly 116 coupled to or disposed in the chamber lid 104 to deliver a flow of one or more processing gases 109 into a processing region 110 through a showerhead 101. The one or more processing gases may include one or more of Ar and/or $C_3H_6$, among other gases. In one example, the one or more processing gases include one or more reactive gases. The showerhead 101 includes a backing plate 126 and a faceplate 130. The gas distribution assembly 116 includes a gas manifold 118 coupled to a gas inlet passage 120 formed in the chamber lid 104. The gas manifold 118 receives a flow of one or more processing gases from one or more gas sources 122 (two are shown). The flow of processing gases received from the one or more gas sources 122 distributes across a gas box 124, flows through a plurality of openings 191 of the backing plate 126, and further distributes across a plenum 128 defined by the backing plate 126 and the faceplate 130. The flow of processing gases 109 then flows into a processing region 110 of the internal volume 106 through one or more gas openings 132 formed in a lower surface 119 of the faceplate 130 of the showerhead 101.

The internal volume 106 includes a pedestal 138 disposed in the chamber body 102. The pedestal 138 supports a substrate 136 within the substrate processing chamber 100. The pedestal 138 supports the substrate 136 on a support surface 139 of the pedestal 138. The pedestal 138 includes a heater and an electrode disposed therein. The electrode may receive direct current (DC) voltage, radio frequency (RF) energy, or alternating current (AC) energy to facilitate processing. The lower surface 119 of the faceplate 130 of the showerhead 101 faces the support surface 139 of the pedestal 138. The support surface 139 faces the lower surface 119 of the faceplate 130 of the showerhead 101. The present disclosure contemplates that the pedestal 138 may be made of a single body, or two or more bodies.

The pedestal 138 is movably disposed in the internal volume 106 by a lift system 195. Movement of the pedestal 138 facilitates transfer of the substrate 136 to and from the internal volume 106 through a slit valve formed through the chamber body 102. The pedestal 138 may also be moved to different processing positions for processing of the substrate 136.

During substrate processing, as processing gases (such as the processing gases 109) flow into the processing region 110, a heater heats the pedestal 138 and the support surface 139. Also during substrate processing, the electrode in the pedestal 138 propagates radio frequency (RF) energy, alternating current (AC), or direct current (DC) voltage to facilitate plasma generation in the processing region 110 and/or to facilitate chucking of the substrate 136 to the pedestal 138. The heat, gases, and energy from the electrode in the pedestal 138 facilitate deposition of a film onto the substrate 136 during substrate processing. The faceplate 130, which is grounded via coupling to the chamber body 102, and the electrode of the pedestal 138, facilitate formation of a capacitive plasma coupling. When power is supplied to the electrode in the pedestal 138, an electric field is generated between the faceplate 130 and pedestal 138 such that atoms of gases present in the processing region 110 between the pedestal 138 and the faceplate 130 are ionized and release electrons. The ionized atoms accelerate to the pedestal 138 to facilitate film formation on the substrate 136.

A pumping device 103 is disposed in the substrate processing chamber 100. The pumping device 103 facilitates removal of gases from the internal volume 106 and processing region 110. The gases exhausted by the pumping device 103 include one or more of a processing gas and a processing residue. The processing residue may result from the process of depositing a film onto the substrate 136.

The pumping device 103 includes a pumping liner 160 disposed on a stepped surface 193 of the chamber body 102 and an isolator ring 159 disposed between the pedestal 138 and the pumping liner 160. The stepped surface 193 is stepped upwards from a bottom surface 154 of the chamber body 102. The stepped surface 193 supports the pumping liner 160. The present disclosure contemplates that the pumping liner 160 may be made of a single body, or two or more bodies. The pumping liner 160 is made from material including one or more of aluminum, aluminum oxide, and/or aluminum nitride. The isolator ring 159 is made from an electrically isolating material, such as a ceramic material. In one example, the isolator ring 159 is made of one or more of quartz, a ceramic material including aluminum such as aluminum oxide and/or aluminum nitride, or any other suitable material. The pumping liner 160 is disposed around the pedestal 138 and encircles the pedestal 138. A portion of a purge gas flow path 111 is between the isolator ring 159 and the pumping liner 160, on one side of the purge gas flow path 111, and the pedestal 138 on the other side of the purge gas flow path 111. The substrate processing chamber 100 includes a purge gas inlet 113 disposed at a bottom of the chamber body 102. The purge gas inlet 113 is an opening formed in a bottom surface of the chamber body 102. The purge gas inlet 113 is fluidly connected to a purge gas source 114 that supplies one or more purge gases 179 to the purge gas inlet 113. A bowl 112 is disposed in the internal volume 106. The bowl 112 defines a purge gas volume 115. One or more bellows 117 may be disposed in the purge gas volume 115. One or more purge gas baffles 161 are disposed in the purge gas volume 115. One or more bellows 121 are disposed above a horizontal portion 112b of the bowl 112 and below a bottom surface 198 of the pedestal 138. The one or more bellows 121 separate a dead volume 163 from a portion of the purge gas flow path 111 that is between the one or more bellows 121 and a vertical portion 112a of the bowl 112.

During substrate processing operations, and while processing gases 109 flow into the processing region 110 from the showerhead 101, the purge gas inlet 113 flows the one or more purge gases 179 into the purge gas volume 115. The horizontal portion 112b of the bowl 112 includes one or more purge gas openings 197 that flow the purge gases 179 from the purge gas volume 115 and into the purge gas flow path 111. The one or more purge gas openings 197 are disposed radially outwardly of the one or more bellows 121. While the processing gases 109 flow toward the substrate 136 to deposit films on the substrate 136, the purge gases 179 flow upwards in the purge gas flow path 111 to prevent the processing gases 109 from diffusing downwards into the purge gas flow path 111. The processing gases 109 and the purge gases 179 meet and/or mix at or near the support surface 139. The processing gases 109 and the purge gases 179 mix to form a gas mixture 148 (illustrated in FIG. 1B) that is exhausted by the pumping device 103. The pumping device 103 includes the pumping liner 160 and the isolator ring 159.

The one or more purge gases 179 include one or more inert gases, such as one or more of Ar and/or $N_2$. The one or more processing gases 109 flow into the processing region 110 from the showerhead 101 at a first flow rate. In one example, the first flow rate is a volumetric flow rate having units of standard cubic centimeters per minute (SCCM). The one or more purge gases 179 flow into the purge gas volume 115 from the purge gas inlet 113 at a second flow rate. In one example, the second flow rate is a volumetric flow rate having units of SCCM. The second flow rate is a ratio R1 relative to the first flow rate. The ratio R1 is within a range of 0.25 to 0.75 of the first flow rate. In one example, the ratio R1 is within a range of 0.25 to 0.50 of the first flow rate, for example 0.25, 0.30, or 0.40. In one example, the ratio R1 is within a range of 0.48 to 0.52. In one embodiment, which can be combined with other embodiments, the ratio R1 is about 0.5 of the first flow rate. The ranges and examples of the ratio R1 of the second flow rate relative to the first flow rate incurs benefits such as preventing at least a portion of processing gases from diffusing into the purge gas flow path 111 below the support surface 139 during substrate processing operations. Reducing or preventing such diffusion reduces or eliminates the likelihood that processing gases 109 will deposit materials onto surfaces other than the substrate 136. Reducing deposition on surfaces other than the substrate 136 reduces or eliminates delays, throughput reductions, operational costs, cleaning time, and/or substrate defects.

The substrate processing chamber 100 is part of a substrate processing system 180 that includes a controller 181 coupled to the substrate processing chamber 100. The controller 181 is part of a non-transitory computer readable medium.

Figure 1B:
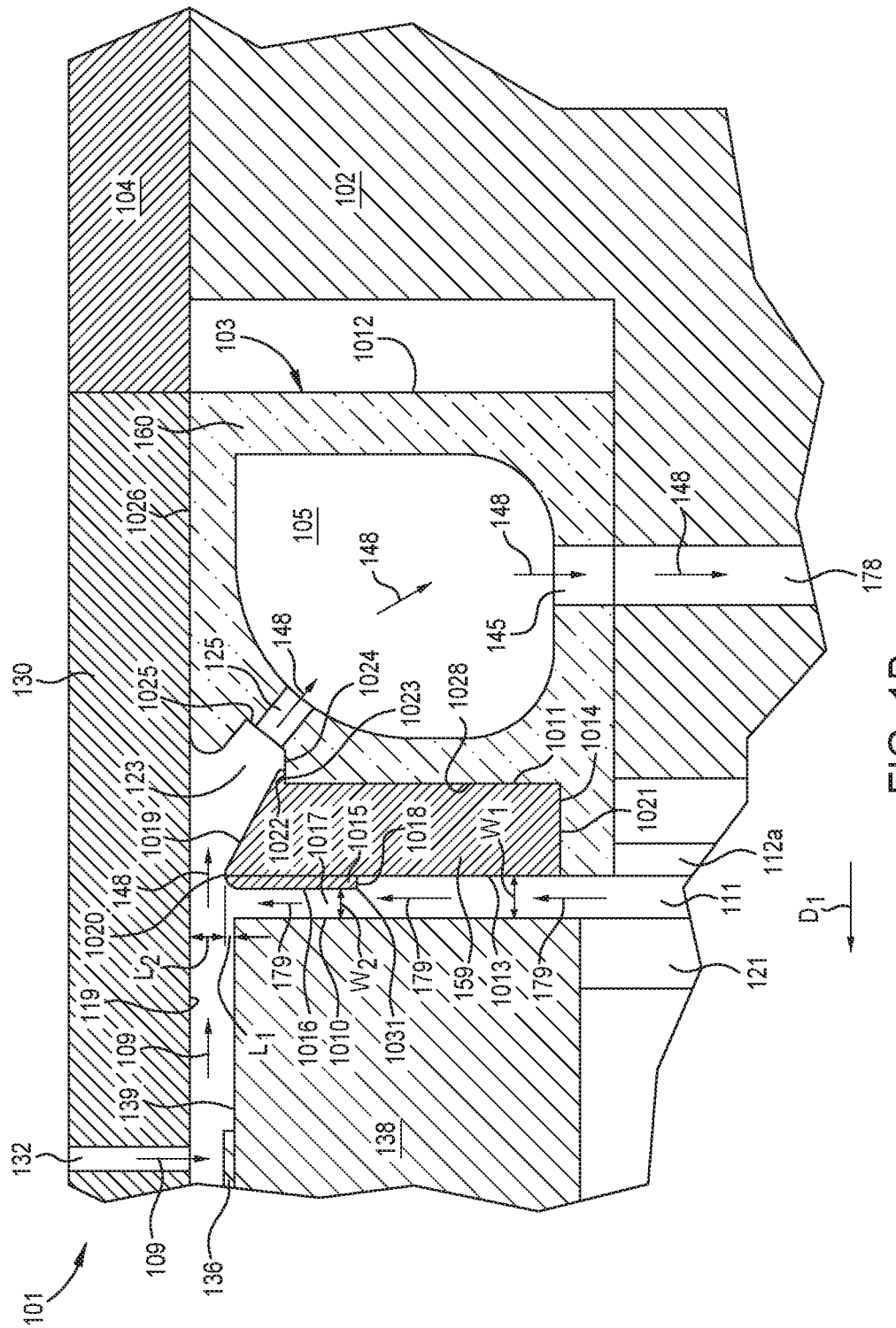
FIG. 1B is an enlarged schematic cross-sectional view of the substrate processing chamber illustrated in FIG. 1A, according to one implementation.

The controller 181 controls aspects of the substrate processing chamber 100 during substrate processing. The controller 181 includes a central processing unit (CPU) 182, a memory 183, and a support circuit 184 for the CPU 182. The controller 181 facilitates control of the components of the substrate processing chamber 100. The controller 181 may be one of any form of general-purpose computers that can be used in an industrial setting for controlling various chamber components and sub-processors. The memory 183 stores instructions, such as software (source code or object code), that may be executed or invoked to control the overall operations of the substrate processing chamber 100 in manners described herein. The controller 181 manipulates respective operations of controllable components in the substrate processing chamber 100. For example, the controller 181 controls the operations of the gas sources 122 to introduce processing gases, the purge gas source 114 to introduce purge gases, and a vacuum pump 133 (described below) to exhaust gases to eliminate or reduce contaminant particles (such as residue) in the substrate processing chamber. As an example, the controller 181 controls the lift system 195 to raise and lower the pedestal 138, and the heater and the electrode of the pedestal 138 to supply heat and energy to facilitate processing. FIG. 1B is an enlarged schematic cross-sectional view of the substrate processing chamber 100 illustrated in FIG. 1A, according to one implementation. The pedestal 138 includes an outer circumferential surface 1010. The pumping liner 160 includes a first outer surface 1011 that faces the outer circumferential surface 1010 of the pedestal 138 and a second outer surface 1012 that faces the chamber body 102. The isolator ring 159 includes a first surface 1013 that faces the outer circumferential surface 1010 of the pedestal 138 and a second surface 1028 that faces the pumping liner 160. The isolator ring 159 is disposed in a shoulder 1014 of the pumping liner 160. The isolator ring 159 includes a protrusion 1015 that protrudes from the first surface 1013 and towards the outer circumferential surface 1010 of the pedestal 138. The protrusion 1015 defines a stepped surface 1016 and a flow edge 1018 of the isolator ring 159. The stepped surface 1016 and the flow edge 1018 are disposed in the purge gas flow path 111. The protrusion 1015 includes a rounded edge 1031 disposed adjacent to the flow edge 1018 at a bottom end of the protrusion 1015. The rounded edge 1031 is disposed between the flow edge 1018 and the stepped surface 1016 on an outer perimeter of the protrusion 1015. The rounded edge 1031 transitions between the flow edge 1018 and the stepped surface 1016.

In one embodiment, which can be combined with other embodiments, the protrusion 1015 is part of the isolator ring 159 such that the protrusion 1015 and the isolator ring 159 form a single integral body. In one embodiment, which can be combined with other embodiments, the protrusion 1015 is a separate body from one or more bodies that make up the isolator ring 159. The protrusion 1015 is made from the same material(s) as the isolator ring 159. In FIGS. 1A and 1B, the protrusion 1015 is shown as having a differing cross section relative to a cross section of the isolator ring 159 for ease of reference. The present disclosure contemplates that the protrusion 1015 and the isolator ring 159 can have the same cross section, such as when the protrusion 1015 and the isolator ring 159 are parts of the same single integral body.

In one embodiment, which can be combined with other embodiments, the protrusion 1015 includes a ring that is coupled to the first surface 1013 of the isolator ring 159. The protrusion 1015 may be coupled to the isolator ring 159 using any suitable method of joining metal materials and/or ceramic materials, such as methods using one or more of bonding, welding, brazing, shrink fitting, interference fitting, fasteners (such as screws, rivets, bolts, nuts, and/or studs), and/or threading engagements.

The isolator ring 159 is disposed such that the first surface 1013 is disposed at a gap from the outer circumferential surface 1010 of the pedestal 138. The gap between the first surface 1013 and the outer circumferential surface 1010 has a first width $W_1$. The protrusion 1015 defines a necked portion 1017 of the gap. The necked portion 1017 includes a second width $W_2$ between the stepped surface 1016 and the outer circumferential surface 1010. The second width $W_2$ is smaller than the first width $W_1$. The second width $W_2$ is a ratio R2 relative to the first width $W_1$. The ratio R2 is within a range of 0.25 to 0.75 of the first width $W_1$. In one example, the ratio R2 is 0.50. In one example, the ratio R2 is 0.75. In one embodiment, which can be combined with other embodiments, the ratio R2 is about 0.25 of the first width $W_1$. In one embodiment, which can be combined with other embodiments, the ratio R2 is within a range of 0.23 to 0.27.

The necked portion 1017 and the gap between the first surface 1013 and the outer circumferential surface 1010 are at least a part of the purge gas flow path 111. The purge gases 179 flow upwards through the gap between the outer circumferential surface 1010 and the first surface 1013 and through the necked portion 1017 to meet the processing gases 109 and form a gas mixture 148. At least part of the purge gases 179 may flow over the flow edge 1018 of the isolator ring 159 and/or around the rounded edge 1031.

The protrusion 1015 increases the flow velocities of the purge gases 179, processing gases 109, and/or the gas mixture 148. The protrusion 1015, and the ratios R2 of the second width $W_2$ relative to the first width $W_1$ discussed above facilitate less processing gases 109 diffusing below the support surface 139 and into the purge gas flow path 111. Less diffusion of the processing gases 109 facilitates less deposition of materials onto surfaces other than the substrate 136, such as the outer circumferential surface 1010, first surface 1013, stepped surface 1016, and surfaces of the bowl 112. Reducing deposition on surfaces other than the substrate 136 reduces or eliminates delays, throughput reductions, operational costs, cleaning time, and/or substrate defects.

The isolator ring 159 includes a tapered upper surface 1019. The tapered upper surface 1019 tapers upwards in a direction $D_1$ from the pumping liner 160 and towards the pedestal 138. The tapered upper surface 1019 intersects with and defines an upper edge 1020. The upper edge 1020 is rounded. The upper edge 1020 defines an upper end of the isolator ring 159 that opposes a lower end of the isolator ring 159 that is defined by a bottom surface 1021 of the isolator ring 159. The isolator ring 159 includes a shoulder 1022 that interfaces with an outer corner 1023 of the pumping liner 160. The outer corner 1023 is a part of an outer surface 1024 of the pumping liner 160 that is on one side of one or more openings 125 (discussed below). The pumping liner 160 includes a shoulder 1025 disposed on an opposite side of the one or more openings 125 relative to the outer surface 1024. The upper end of the isolator ring 159 that is defined by the upper edge 1020 is disposed above the support surface 139 of the pedestal 138, including when the pedestal 138 is in a raised position that is a processing position. The upper end of the isolator ring 159 is disposed above the support surface 139 by a first distance $L_1$ from the support surface 139. The first distance $L_1$ is within a range of 0.0 mm to 3.0 mm, such as 1.0 mm to 2.0 mm or 1.9 mm to 2.1 mm. In one embodiment, which can be combined with other embodiments, the first distance $L_1$ is about 2.0 mm.

The upper end of the isolator ring 159 is disposed below the lower surface 119 of the faceplate 130 of the showerhead 101 by a second distance $L_2$ from the lower surface 119. The second distance $L_2$ is within a range of 4.0 mm to 7.0 mm. The first distance $L_1$ and the second distance $L_2$ may be present when the substrate processing chamber 100 is processing the substrate 136, such as when the pedestal 138 is positioned in a raised portion that is a processing position to process the substrate 136. The first distance $L_1$ and the second distance $L_2$ add together to equal a total gap between the lower surface 119 of the faceplate 130 and the support surface 139 of the pedestal 138. In one example, the first distance $L_1$ is within a range of 0 percent to 50 percent of the total gap, such as 10 percent to 45 percent of the total gap. In one example, the second distance $L_2$ is within a range of 50 percent to 100 percent of the total gap, such as 55 percent to 90 percent of the total gap. In one example, the total gap is within a range of 5.0 mm to 10.0 mm, such as 7.0 mm.

The first distance $L_1$ and/or the second distance $L_2$ increase the flow velocities of the purge gases 179, processing gases 109, and/or the gas mixture 148. For example, the flow velocities of the purge gases 179, processing gases 109, and/or the gas mixture 148 are increased as the purge gases 179, processing gases 109, and/or the gas mixture 148 flow between the isolator ring 159 and the showerhead 101. The first distance $L_1$ and the second distance $L_2$ discussed above facilitate less processing gases 109 diffusing below the support surface 139 and into the purge gas flow path 111. Less diffusion of the processing gases 109 facilitates less deposition of materials onto surfaces other than the substrate 136. As an example, less diffusion of the processing gases 109 facilitates less deposition of materials onto the outer circumferential surface 1010, first surface 1013, stepped surface 1016, and surfaces of the bowl 112. Reducing deposition on surfaces other than the substrate 136 reduces or eliminates delays, throughput reductions, operational costs, cleaning time, and/or substrate defects.

The gas mixture 148 is exhausted using the pumping device 103 that includes the pumping liner 160 and the isolator ring 159. The gas mixture 148 flows through one or more openings 123 between the isolator ring 159 and the pumping liner 160, and through one or more openings 125 formed in a wall of the pumping liner 160. The gas mixture 148 flows into an annulus 105 of the pumping liner 160 and through an exhaust port 145 formed in the pumping liner 160. The pumping liner 160 includes an upper outer surface 1026 that interfaces with the lower surface 119 of the faceplate 130 of the showerhead 101.

Referring back to FIG. 1A, the pumping liner 160 is fluidly coupled to a foreline 172 through a first conduit 176 and a second conduit 178. The foreline 172 includes a first vertical conduit 131, a second vertical conduit 134, a horizontal conduit 135, and an exit conduit 143. The exit conduit 143, in one example, is a third vertical conduit. In one example, the first conduit 176 and the second conduit 178 are openings formed in the chamber body 102. The present disclosure contemplates that the first conduit 176 and the second conduit 178 could be tubes are other flow devices that extend between a surface of the chamber body 102, such as bottom surface 154, and the pumping liner 160. As an example, the first conduit 176 and the second conduit 178 could be part of the first vertical conduit 131 and the second vertical conduit 134, respectively. In such an example, the first vertical conduit 131 and the second vertical conduit 134 may extend through the chamber body 102 and be coupled to the pumping liner 160. In one embodiment, which can be combined with other embodiments, the first conduit 176 and the second conduit 178 each is an opening formed in one or more sidewalls of the chamber body 102.

The first conduit 176 is fluidly coupled to the pumping liner 160 and the first vertical conduit 131 of the foreline 172. The second conduit 178 is fluidly coupled to the pumping liner 160 and the second vertical conduit 134 of the foreline 172. The first vertical conduit 131 and the second vertical conduit 134 are fluidly coupled to the horizontal conduit 135. The horizontal conduit 135 includes a first portion 137 coupled to the first vertical conduit 131, a second portion 140 coupled to the second vertical conduit 134, and a third portion 141 coupled to the exit conduit 143. The horizontal conduit 135 includes a first end 149 adjacent to the first vertical conduit 131 and a second end 151 adjacent to the second vertical conduit 134. The horizontal conduit 135 can be made up of a single body or can be fabricated from one or more components.

The first conduit 176, second conduit 178, first vertical conduit 131, second vertical conduit 134, and horizontal conduit 135 are configured to direct gases therethrough. The present disclosure contemplates that the first conduit 176, second conduit 178, first vertical conduit 131 and second vertical conduit 134 need not be completely vertical and may be angled or may include one or more bends and/or angles. The present disclosure also contemplates that the horizontal conduit 135 need not be completely horizontal and may be angled or may include one or more bends and/or angles.

The exit conduit 143 is fluidly coupled to a vacuum pump 133 to control the pressure within the processing region 110 and to exhaust gases and residue from the processing region 110. The vacuum pump 133 exhausts gases from the processing region 110 through the pumping liner 160, the first conduit 176, the second conduit 178, the first vertical conduit 131, the second vertical conduit 134, the horizontal conduit 135, and the exit conduit 143 of the foreline 172.

The exhaust port 145 (illustrated in FIG. 1B) is fluidly coupled to the exit conduit 143 through the second conduit 178, second vertical conduit 134 and the horizontal conduit 135. The gas mixture 148 flows from the annulus 105, through the exhaust port 145, and into the second conduit 178. A second exhaust port of the pumping liner 160 is disposed between the annulus 105 and the first conduit 176. The second exhaust port is fluidly coupled to the exit conduit 143 through the first conduit 176, first vertical conduit 131 and the horizontal conduit 135. In addition to flowing through the exhaust port 145, the gas mixture 148 may flow through the second exhaust port and into the first conduit 176.

The first vertical conduit 131 is configured to flow the gas mixture 148 from the first conduit 176 and into the first portion 137 of the horizontal conduit 135. The second vertical conduit 134 is configured to flow the gas mixture 148 from the second conduit 178 and into the second portion 140 of the horizontal conduit 135. The first portion 137 and the second portion of the horizontal conduit 135 are configured to flow the gas mixture 148 from the first vertical conduit 131 and the second vertical conduit 134, respectively, and into the third portion 141 of the horizontal conduit 135. The third portion 141 of the horizontal conduit 135 is configured to flow the gas mixture 148 from the horizontal conduit 135 and into the exit conduit 143. The exit conduit 143 is configured to exhaust the gas mixture 148 from the exhaust port 145 and the second exhaust port that is disposed between the annulus 105 and the first conduit 176.

Although FIGS. 1A, 1B illustrate two conduits 176, 178; two vertical conduits 131, 134; and a pumping liner 160 with an exhaust port 145 and a second exhaust port; the present disclosure contemplates that a larger number of conduits, vertical conduits and/or exhaust ports could be implemented. For example, the pumping liner 160 could have at least three exhaust ports that are fluidly coupled to respective conduits and vertical conduits. The third conduit may be coupled to the third vertical conduit and the third vertical conduit may be coupled to the horizontal conduit 135. The three exhaust ports could be disposed along a circumferential axis of the pumping liner 160 approximately equidistant from each other, such as 120 degrees from each other.

Figure 2:
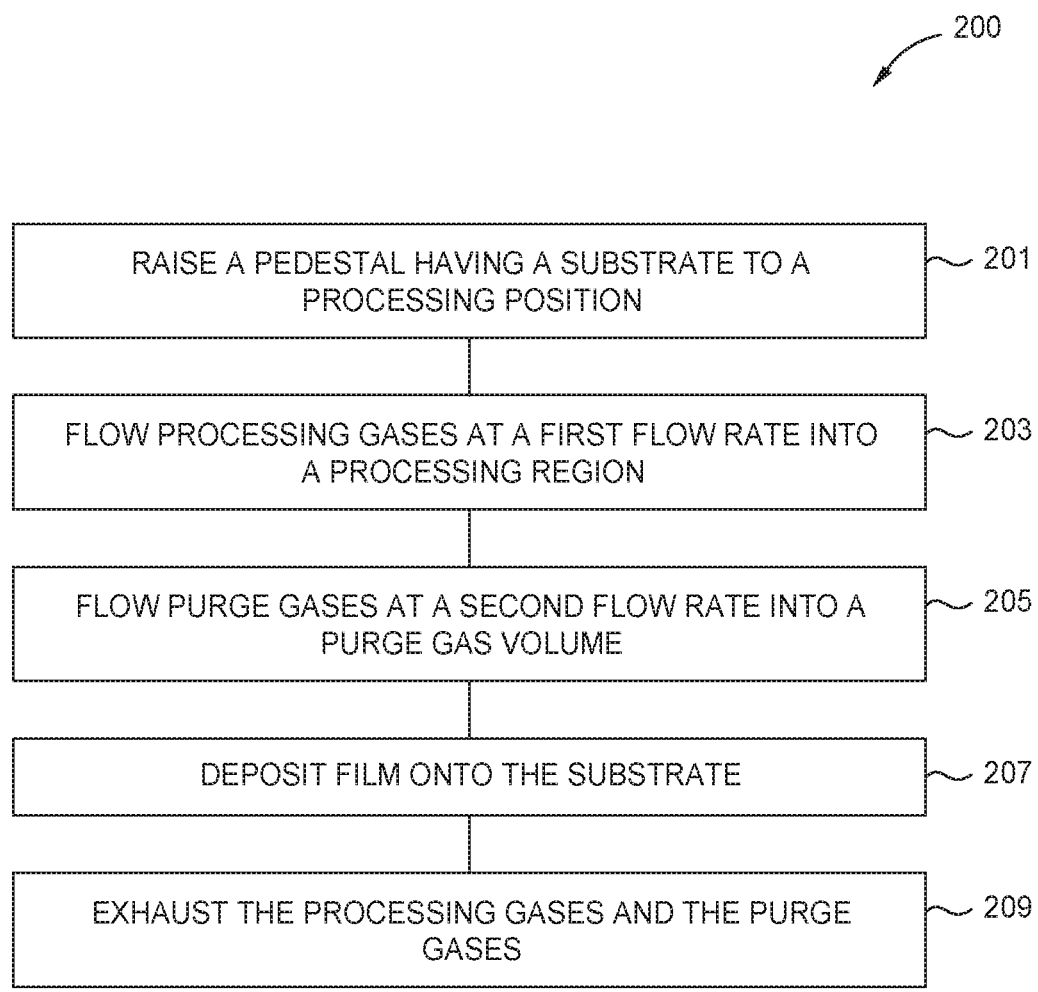
FIG. 2 is a schematic view of a method of operating a substrate processing chamber, according to one implementation.

FIG. 2 is a schematic view of a method 200 of operating a substrate processing chamber, according to one implementation. The method 200 of operating the substrate processing chamber is to process one or more substrates, such as to deposit film on the one or more substrates. The method 200 includes, at operation 201, raising a pedestal to a processing position. The pedestal includes a substrate to be processed disposed on a support surface of the pedestal.

Operation 203 includes flowing one or more processing gases at a first flow rate from a showerhead above the pedestal and into a processing region of the substrate processing chamber. Operation 205 includes flowing one or more purge gases at a second flow rate from a purge gas inlet and into a purge gas volume of the substrate processing chamber. In one embodiment, which can be combined with other embodiments, the processing gases and the purge gases are flowed simultaneously into the substrate processing chamber. Using the processing gases and CVD processing, operation 207 includes depositing film onto the substrate. The processing gases and the purge gases may combine to form a gas mixture. Operation 209 includes exhausting the gas mixture that includes the processing gases and the purge gases from the substrate processing chamber. The present disclosure contemplates that one or more aspects, features, components, and/or properties of the method 200 may be combined with one or more aspects, features, components, and/or properties of the substrate processing chamber 100.

The present disclosure contemplates that the operations of the method 200 may be conducted using the controller 181 and the substrate processing system 180 shown in FIG. 1A.

The method 200 shown is not limited to the sequence or number of acts illustrated in FIG. 2, and may include embodiments that include re-ordering, repeating, adding, and/or removing one or more of the operations 201, 203, 205, 207, and/or 209.

Benefits of the present disclosure include preventing diffusion of processing gases below a support surface of a pedestal; reduced deposition of materials and/or residue on surfaces of components that are not a substrate; increased velocities of processing gases, purge gases, and/or a gas mixture; reduced delays; increased throughput; reduced chamber downtime; reduced operational costs; reduced cleaning time; and reduced substrate defects.

Aspects of the present disclosure include a protrusion that protrudes from a first surface of an isolator ring and towards an outer circumferential surface of a pedestal; an upper edge of an isolator ring being disposed above a support surface of a pedestal; and a second flow rate of one or more purge gases having a ratio of the second flow rate relative to a first flow rate of one or more processing gases, and the ratio is within a range of 0.25 to 0.75 of the first flow rate.

It is contemplated that one or more aspects disclosed herein may be combined. Moreover, it is contemplated that one or more aspects disclosed herein may include some or all of the aforementioned benefits. As an example, a ratio R2 of the second width $W_2$ relative to the first width $W_1$ being about 0.25 results in up to a 44% reduction in diffusion of processing gases below the support surface 139 of the pedestal 138. Additionally, a ratio R1 of a second flow rate of purge gases relative to a first flow rate of processing gases being about 0.50 results in an additional 73% reduction in diffusion of processing gases below the support surface 139 of the pedestal 138 (in addition to the 44% reduction). Moreover, a first distance $L_1$ of the isolator ring 159 of about 2.0 mm results in up to a 54% reduction in diffusion of processing gases (as combined with the 44% reduction).

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:
1. A substrate processing chamber, comprising:
 a chamber body;
 a showerhead having one or more gas openings formed in a lower surface of the showerhead;
 a pedestal disposed in the chamber body, the pedestal having a support surface and an outer circumferential surface, the support surface facing the showerhead;
 a pumping liner disposed around the pedestal and encircling the pedestal, the pumping liner having a first outer surface that faces the outer circumferential surface of the pedestal and a second outer surface that faces the chamber body; and an isolator ring disposed between the pedestal and the pumping liner, the isolator ring comprising:
  a first surface that faces the pedestal, the first surface being disposed at a gap from the outer circumferential surface of the pedestal,
  a second surface that faces the pumping liner, and
  a protrusion that protrudes from the first surface of the isolator ring and towards the outer circumferential surface of the pedestal, the protrusion defining a necked portion of the gap between the pedestal and the first surface of the isolator ring, and defining a stepped surface of the isolator ring;
  wherein:
    the gap between the first surface of the isolator ring and the outer circumferential surface of the pedestal has a first width;
    the necked portion between the stepped surface of the isolator ring and the outer circumferential surface of the pedestal has a second width smaller than first width; and
    the second width is a ratio of the first width, the ratio within a range of 0.25 to 0.75.

2. The substrate processing chamber of claim 1, wherein the isolator ring comprises an electrically isolating material.

3. The substrate processing chamber of claim 1, further comprising a purge gas inlet disposed at a bottom of the chamber body, wherein the isolator ring and the gap are disposed between the purge gas inlet and the showerhead.

4. The substrate processing chamber of claim 3, wherein the gap is part of a purge gas flow path, and the protrusion defines a flow edge disposed in the purge gas flow path.

5. A substrate processing chamber, comprising:
a chamber body;
a showerhead having one or more gas openings formed in a lower surface of the showerhead;
a pedestal disposed in the chamber body, the pedestal having a support surface and an outer circumferential surface, the support surface facing the showerhead;
a pumping liner disposed around the pedestal and encircling the pedestal, the pumping liner having a first outer surface that faces the outer circumferential surface of the pedestal and a second outer surface that faces the chamber body; and
an isolator ring disposed between the pedestal and the pumping liner, the isolator ring comprising:
  a first surface that faces the pedestal, the first surface being disposed at a gap from the outer circumferential surface of the pedestal,
  a second surface that faces the pumping liner, and
  a protrusion that protrudes from the first surface of the isolator ring and towards the outer circumferential surface of the pedestal, the protrusion defining a necked portion of the gap between the pedestal and the first surface of the isolator ring, and defining a stepped surface of the isolator ring;
  wherein:
    the gap between the first surface of the isolator ring and the outer circumferential surface of the pedestal has a first width;
    the necked portion between the stepped surface of the isolator ring and the outer circumferential surface of the pedestal has a second width smaller than first width; and
    the second width is a ratio of the first width, and the ratio is within a range of 0.23 to 0.27.

6. A substrate processing chamber, comprising:
a chamber body;
a showerhead having one or more gas openings formed in a lower surface of the showerhead;
a pedestal disposed in the chamber body, the pedestal having a support surface and an outer circumferential surface, the support surface facing the showerhead;
a pumping liner disposed around the pedestal and encircling the pedestal, the pumping liner having a first outer surface that faces the outer circumferential surface of the pedestal and a second outer surface that faces the chamber body; and
an isolator ring disposed between the pedestal and the pumping liner, the isolator ring comprising:
  a first surface that faces the pedestal,
  a second surface that faces the pumping liner, and
  a tapered upper surface, the tapered upper surface tapering upwards in a direction from the pumping liner and towards the pedestal, and defining an upper edge of the isolator ring, the upper edge of the isolator ring being disposed above the support surface of the pedestal;
  wherein:
    the upper edge of the isolator ring is disposed at a distance from the lower surface of the showerhead;
    the support surface of the pedestal is disposed at a gap from the lower surface of the showerhead; and
    the distance is within a range of 50 percent to 100 percent of the gap.

7. The substrate processing chamber of claim 6, wherein the distance is within a range of 4.0 mm to 7.0 mm.

8. The substrate processing chamber of claim 6, wherein:
the first surface of the isolator ring that faces the pedestal is disposed at a gap from the outer circumferential surface of the pedestal; and
the isolator ring further comprises a protrusion that protrudes from the first surface of the isolator ring and towards the outer circumferential surface of the pedestal, the protrusion defining a necked portion of the gap between the pedestal and the isolator ring.

9. The substrate processing chamber of claim 8, wherein:
the protrusion defines a stepped surface of the isolator ring;
the gap between the first surface of the isolator ring and the outer circumferential surface of the pedestal has a first width; and
the necked portion between the stepped surface of the isolator ring and the outer circumferential surface of the pedestal has a second width that is smaller than first width.

10. The substrate processing chamber of claim 9, wherein the second width is a ratio of the first width, and the ratio is within a range of 0.25 to 0.75.

11. The substrate processing chamber of claim 9, wherein the second width is a ratio of the first width, and the ratio is within a range of 0.23 to 0.27.

12. The substrate processing chamber of claim 5, wherein the isolator ring comprises an electrically isolating material.

13. The substrate processing chamber of claim 5, further comprising a purge gas inlet disposed at a bottom of the chamber body, wherein the isolator ring and the gap are disposed between the purge gas inlet and the showerhead.

14. The substrate processing chamber of claim 13, wherein the gap is part of a purge gas flow path, and the protrusion defines a flow edge disposed in the purge gas flow path.

* * * * *